United States Patent
Pyo

(10) Patent No.: US 12,041,736 B2
(45) Date of Patent: Jul. 16, 2024

(54) ROLLABLE DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 258 days.

(21) Appl. No.: 17/631,101

(22) PCT Filed: Aug. 7, 2019

(86) PCT No.: PCT/KR2019/009886
§ 371 (c)(1),
(2) Date: Jan. 28, 2022

(87) PCT Pub. No.: WO2021/025205
PCT Pub. Date: Feb. 11, 2021

(65) Prior Publication Data
US 2022/0279668 A1  Sep. 1, 2022

(51) Int. Cl.
| H05K 5/02 | (2006.01) |
| H05K 5/00 | (2006.01) |
| H10K 77/10 | (2023.01) |
| H10K 102/00 | (2023.01) |

(52) U.S. Cl.
CPC ......... H05K 5/0217 (2013.01); H05K 5/0017 (2013.01); *H10K 77/111* (2023.02); *H10K 2102/311* (2023.02)

(58) Field of Classification Search
CPC .. H05K 5/0217; H05K 5/0017; H10K 77/111; H10K 2102/311; G06F 1/1656; G06F 1/1652; G06F 1/16; G09F 9/301
See application file for complete search history.

(56) References Cited

U.S. PATENT DOCUMENTS

| 2017/0325343 A1* | 11/2017 | Seo .................. G03B 21/58 |
| 2018/0070467 A1* | 3/2018 | Kim .................. H10K 50/84 |
| 2018/0359869 A1 | 12/2018 | Kim et al. |
| 2019/0150300 A1 | 5/2019 | Kim et al. |

FOREIGN PATENT DOCUMENTS

| KR | 10-2016-0047651 A | 5/2016 |
| KR | 10-2017-0123854 A | 11/2017 |
| KR | 10-2017-0126061 A | 11/2017 |
| KR | 10-1945985 B1 | 2/2019 |
| KR | 10-2019-0054427 A | 5/2019 |

\* cited by examiner

*Primary Examiner* — Anthony Q Edwards
*Assistant Examiner* — Hung Q Dang
(74) *Attorney, Agent, or Firm* — Birch, Stewart, Kolasch & Birch, LLP

(57) ABSTRACT

A rollable display device comprises: a flexible display panel; a mesh sheet comprising, a first region where the flexible display panel is attached on a front surface thereof, a second region located above the first region, and a stepped part between the first region and the second region; a guide plate for receiving the upper portion of the mesh sheet including the second region and the stepped part, and comprising a fixing part positioned on the back surface thereof; a top cover for covering the guide plate and comprising a pressing hole formed in a location corresponding to the fixing part; and a pressing member inserted in the pressing hole so as to adhere the fixing part to the mesh sheet. The rollable display device may stably withstand the tension of the mesh sheet.

16 Claims, 7 Drawing Sheets

(a)　　　　　　　　　(b)

(a)

(b)

(a)          (b)

(a)    (b)

(a)  (b)

ROLLABLE DISPLAY DEVICE

CROSS REFERENCE TO RELATED APPLICATIONS

This application is the National Phase of PCT International Application No. PCT/KR2019/009886, filed on Aug. 7, 2019, all of which are hereby expressly incorporated by reference into the present application.

TECHNICAL FIELD

The present disclosure relates to a rollable display device having a slim structure and capable of effectively withstanding the tension of a mesh sheet onto which a flexible display panel is attached.

BACKGROUND ART

Generally, a display device employing a flat display panel, such as a liquid crystal display device, an organic light-emitting diode display device, a light-emitting diode display device, or an electrophoretic display device, has been adopted mainly in laptop computers, portable electronic devices, televisions, or monitors.

Conventional flat display panels are limited as to the range of application thereof because such flat display panels use inflexible glass substrates. For this reason, in recent years, a rollable display device capable of being curved using a flexible substrate such as a plastic substrate instead of a non-flexible glass substrate is attracting attention as a new display.

However, in the case of a conventional rollable display device in which a flexible display panel is raised and lowered, the thickness of a mesh sheet onto which the flexible display panel is attached is reduced, thereby causing a fastening part, which provides tension, to be easily deformed.

In addition, since the thickness of the structure in the flexible display panel that is configured to provide tension is increased, it is difficult to provide a slim appearance corresponding to the recent trend whereby flexible display panels are becoming thinner.

Furthermore, a structure configured to maintain the tension in the flexible display panel and a structure to cover the structure are complicated, thereby making processing and assembly thereof cumbersome.

DISCLOSURE

Technical Task

An aspect of one embodiment of the present disclosure is to provide a rollable display device capable of reliably withstanding the tension of a mesh sheet.

An aspect of another embodiment of the present disclosure is to provide a rollable display device capable of realizing a slim appearance.

An aspect of still another embodiment of the present disclosure is to provide a rollable display device having an improved assembling performance.

Technical Solutions

A rollable display device according to one embodiment may include a flexible display panel, a mesh sheet including, a first region where the flexible display panel is attached on a front surface thereof, a second region located above the first region, and a stepped part between the first region and the second region, a guide plate, configured to receive the upper portion of the mesh sheet including the second region and the stepped part, and including a fixing part positioned on the back surface thereof, a top cover configured to cover the guide plate and having therein a pressing hole formed at a location corresponding to the fixing part, and a pressing member inserted into the pressing hole so as to adhere the fixing part to the mesh sheet.

The guide plate may include a first seating part formed to protrude in a second direction, which is opposite a first direction, so as to seat the stepped part on one side of the first seating part.

The guide plate may be provided as a U-shaped frame with one side thereof open, and the first seating part may be formed at an end portion of the one side of the U-shaped frame.

The top cover may include a second seating part formed to protrude in the second direction, which is opposite the first direction, so as to seat thereon the other side of the first seating part.

The fixing part may be deformed in shape due to being pressed by the pressing member.

The fixing part may be formed by cutting out a portion of the guide plate.

A periphery of the fixing part may include a connection part connected to the rear surface of the guide plate and a cutout formed by cutting out a portion of the rear surface of the guide plate, and the connection part may be bent due to being pressed by the pressing member.

The pressing member may include, at an end portion thereof in the first direction, a pressing surface configured to press the fixing part.

The pressing member may be inserted in the first direction.

The first direction may be a direction toward the position of the flexible display panel.

The rollable display device may further include a main roller configured to wind or unwind the flexible display panel, a link coupled to one side of the top cover, and a link-driving unit configured to drive the link so as to raise or lower the top cover.

The top cover may be provided with, on one side thereof, a fastening part to which the link is coupled.

Advantageous Effects

According to one embodiment of the present disclosure, a rollable display device of the present disclosure may be capable of reliably withstanding the tension of a mesh sheet.

According to another embodiment of the present disclosure, a rollable display device of the present disclosure may realize a slim appearance.

According to still another embodiment of the present disclosure, a rollable display device of the present disclosure has an improved assembling performance.

Additional scope of applicability of the present disclosure will become apparent from the following detailed description. Moreover, various changes and modifications within the spirit and scope of the present disclosure will be clearly understood by those skilled in the art, and therefore, specific embodiments, such as the detailed description and the preferred embodiment of the present disclosure, should be understood to be given by way of example only.

BEST MODE FOR DISCLOSURE

Figure 1:
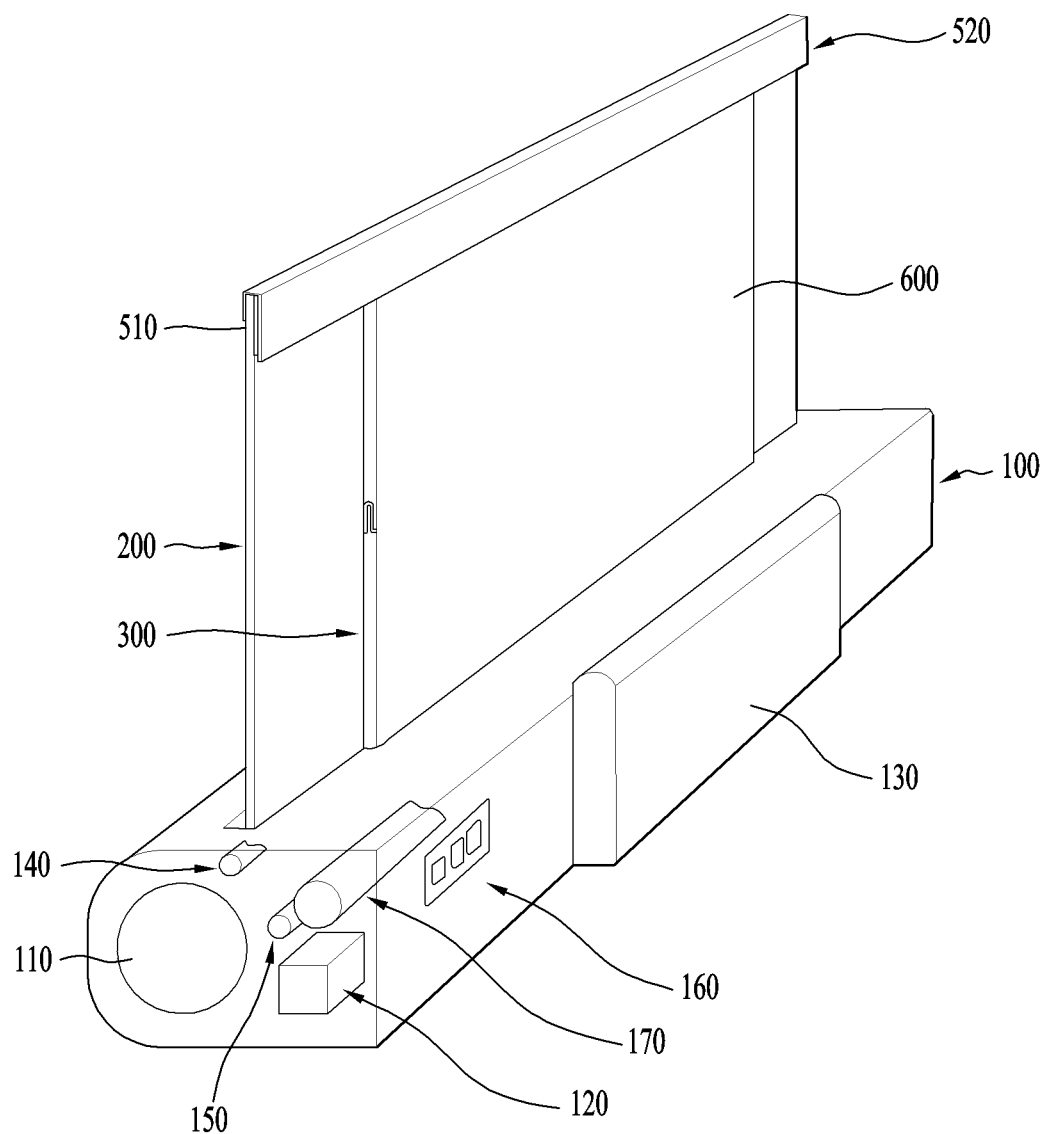
FIG. 1 is a view illustrating a rollable display device related to the present disclosure.

Hereinafter, embodiments of the present disclosure will be described in detail with reference to the accompanying drawings, the same reference numerals are used to designate the same/like components, and a redundant description thereof will be omitted. In general, a suffix such as "module" and "unit" may be used to refer to elements or components. Use of such a suffix herein is merely intended to facilitate description of the specification, and the suffix itself is not intended to indicate any special meaning or function. In describing the present disclosure, if a detailed explanation of a related known function or construction is considered to unnecessarily distract from the gist of the present disclosure, such explanation, which would be obvious to those skilled in the art, has been omitted. The accompanying drawings are used only to help easily understand the technical idea of the present disclosure, and it should be understood that the idea of the present disclosure is not limited by the accompanying drawings. The idea of the present disclosure should be construed to encompass any alterations, equivalents and substitutes beyond what is shown in the accompanying drawings.

Terms including ordinals, such as "first", "second", etc., may be used to describe various elements, but the elements are not limited to these terms. The terms are used only for the purpose of distinguishing one component from another.

It is to be understood that when an element is referred to as being "connected" or "linked" to another element, it may be directly connected or connected to the other element. On the other hand, when an element is referred to as being "directly connected" or "directly linked" to another element, it should be understood that there are no other elements in between.

Singular expressions include plural meanings, unless the context clearly dictates otherwise.

In the present application, the terms "comprises", "having", and the like are used to specify that a feature, a number, a step, an operation, an element, a component, is included, but do not preclude the presence or addition of one or more other features, numbers, steps, operations, elements, components, or combinations thereof.

FIG. 1 is a view illustrating a rollable display device 10 related to the present disclosure.

Referring to FIG. 1, the rollable display device may include a main body 100, a flexible display panel 200, and a link assembly 300.

The main body 100 may provide a space in which to accommodate the flexible display panel 200 and the link assembly 300. For example, the main body 100 may include a main roller 110, around which the flexible display panel 200 is wound, and a link-driving unit 120 configured to drive the link assembly 300. The main body 100 may further include a set power board box 130 that supplies a signal to implement an image on the flexible display panel 200. The set power board box 130 may be located on the rear surface of the main body 100.

The main roller 110 may have a cylindrical shape. The flexible display panel 200 may be wound around the outer surface of the main roller 110. For example, the lower end portion of the flexible display panel 200 may be coupled with the main roller 110. The main roller 110 may prevent the flexible display panel 200 from being damaged during an unwinding operation and/or a winding operation. For example, the main body 100 may further include an elastic member configured to rotate the main roller 110 in the state in which the flexible display panel 200 is fully wound. The elastic member may include a spring.

The main body 100 may further include auxiliary rollers 140 and 150 configured to assist in the movement of the flexible display panel 200. For example, the front surface of the flexible display panel 200, which is wound around the main roller 110, may contact a front auxiliary roller 140, and the rear surface of the flexible display panel 200 may contact a rear auxiliary roller 150. The front auxiliary roller 140 and the rear auxiliary roller 150 may be located at different heights.

The link-driving unit 120 may rotate or move the link assembly 300 so as to raise or lower the upper end portion of the flexible display panel 200. The flexible display panel 200 wound around the main roller 110 may be fully unwound by the link-driving unit 120. The fully unwound flexible display panel 200 may be moved in the direction towards the main roller 110 by the link-driving unit 120. The flexible display panel 200 is moved in the direction towards the main roller 110 by the link-driving unit 120 may be wound around the outer surface of the main roller 110 by the rotation of the main roller 110.

The main body 100 may further include a control panel 160 configured to control the link-driving unit 120. The control panel 160 may be located on the rear surface of the main body 100.

The flexible display panel 200 may be a display panel that realizes an image and is flexible. For example, the flexible display panel 200 may include a first flexible substrate and a second flexible substrate adhered to the first flexible substrate. A light-emitting device or a light-transmittance adjusting means may be positioned between the first flexible substrate and the second flexible substrate. For example, the flexible display panel 200 may be an organic light-emitting diode (OLED) panel including an organic light-emitting layer.

The link assembly 300 may be connected to the link-driving unit 120. The link assembly 300 may be rotated or moved by the link-driving unit 120 so as to raise or lower the upper end portion of the flexible display panel 200. For example, the link assembly 300 may connect the link-driving unit 120 and the upper end portion of the flexible display panel 200.

The link assembly 300 may be located on the rear surface of the flexible display panel 200. The rollable display device may further include a rear cover 600 configured to hide the operation of the link assembly 300. The link assembly 300 may operate between the flexible display panel 200 and the rear cover 600.

Figure 2:
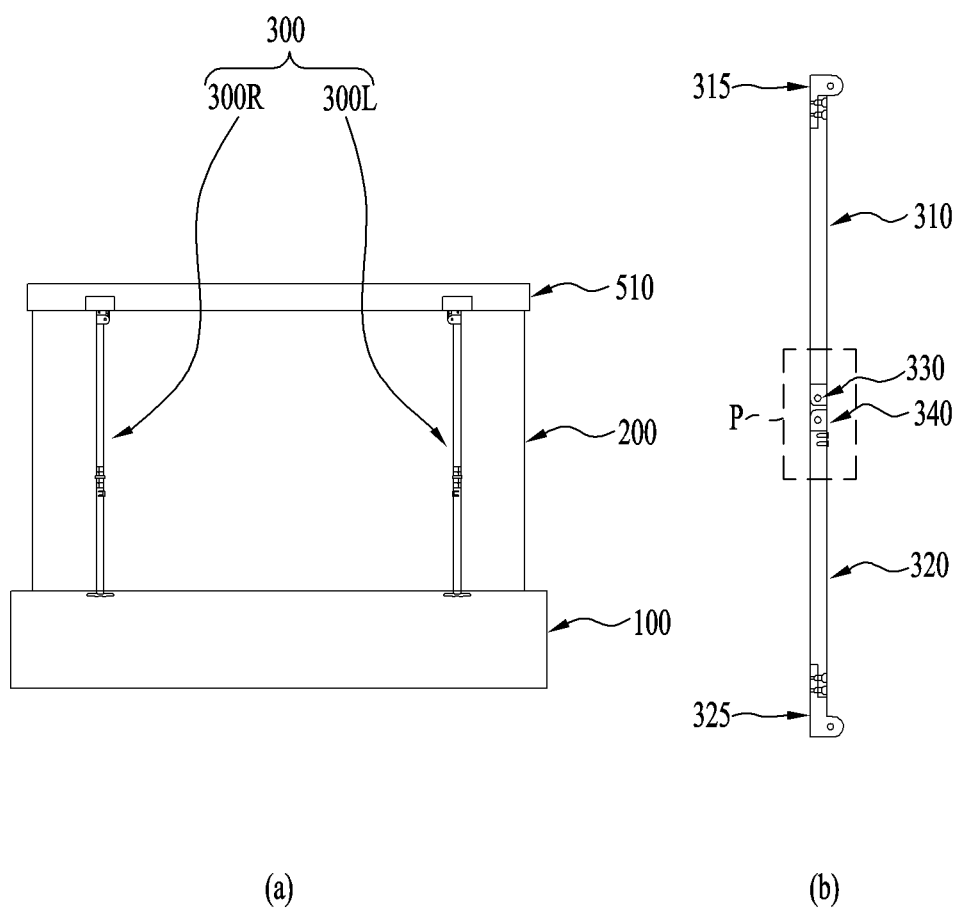
FIG. 2 is a view illustrating a rear surface and a first link assembly of a rollable display device related to the present disclosure.

FIG. 2 is a view illustrating the rear surface and a first link assembly of the rollable display device related to the present disclosure.

FIG. 2(a) is a view illustrating the rear surface of the rollable display device. FIG. 2(b) is a view illustrating a first link assembly 300R of the rollable display device when the flexible display panel is fully unwound.

Referring to FIGS. 1, 2(a), and 2(b), the link assembly 300 of the rollable display device may include the first link assembly 300R and a second link assembly 300L.

Each of the first link assembly 300R and the second link assembly 300L may be located close to a corresponding one of opposing sides of the flexible display panel 200. For example, based on the view in FIG. 2(a), the first link assembly 300R may be located close to the rear left side of the flexible display panel 200, and the second link assembly 300L may be located close to the rear right side of the flexible display panel 200.

When the flexible display panel 200 is fully unwound, the link assembly 300 may have an I-shape. For example, when the flexible display panel 200 is fully unwound, the link assembly 300 may completely fill the space between the flexible display panel 200 and the rear cover 600. When the flexible display panel 200 is fully unwound, the flexible display panel 200, the link assembly 300, and the rear cover 600 may create an empty space therebetween.

The rollable display device includes the link assembly 300, which has an I-shape when the flexible display panel 200 is fully unwound. Accordingly, in the rollable display device according to an embodiment of the present disclosure, a separate finishing for the side surfaces may not be needed. Accordingly, in the rollable display device according to an embodiment of the present disclosure, the side portions may be slimmed.

The first link assembly 300R may include an upper link frame 310, a lower link frame 320, a central link connection part 330, and an elastic plate 340. The second link assembly 300L may have the same configuration as the first link assembly 300R. For example, the second link assembly 300L may be symmetrical with the first link assembly 300R.

In the rollable display device, the first link assembly 300R and the second link assembly 300L are described as being symmetrical with each other. However, in the rollable display device, the second link assembly 300L may have the same shape as the first link assembly 300R. For example, in the rollable display device, the first link assembly 300R and the second link assembly 300L may be rotated in the same direction by the link-driving unit 230.

The lower link frame 320 may connect the link-driving unit 120 and the central link connection part 330. For example, the lower link frame 320 may include a lower link bracket 325, which is to be connected to the link-driving unit 120.

The lower link frame 320 may be rotated by the link-driving unit 120. The link-driving unit 120 may rotate the lower link frame 320 on the rear surface of the flexible display panel 200 using the lower link bracket 325. For example, when winding the fully unwound flexible display panel 200, the upper end portion of the lower link frame 320 may be moved towards the central portion of the flexible display panel 200 by the link-driving unit 120.

The upper link frame 310 may connect the upper end portion of the flexible display panel 200 and the central link connection part 330. For example, the upper link frame 310 may include an upper link bracket 315, which is to be connected to the upper end portion of the flexible display panel 200.

Figure 3:
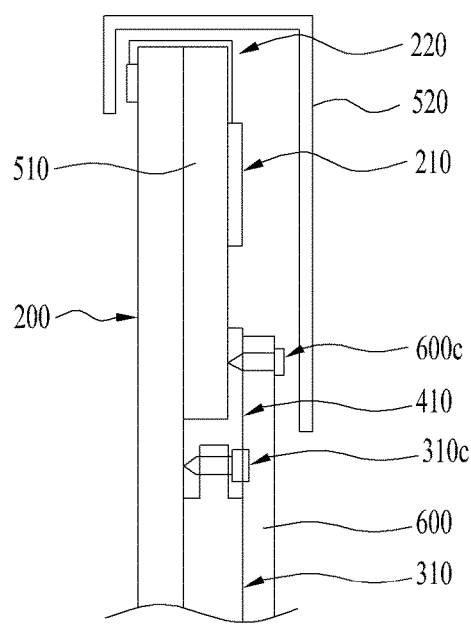
FIG. 3 is a view illustrating a connection relationship between an upper end portion of a flexible display panel and an upper link frame of a rollable display device related to the present disclosure.
Figure 3:
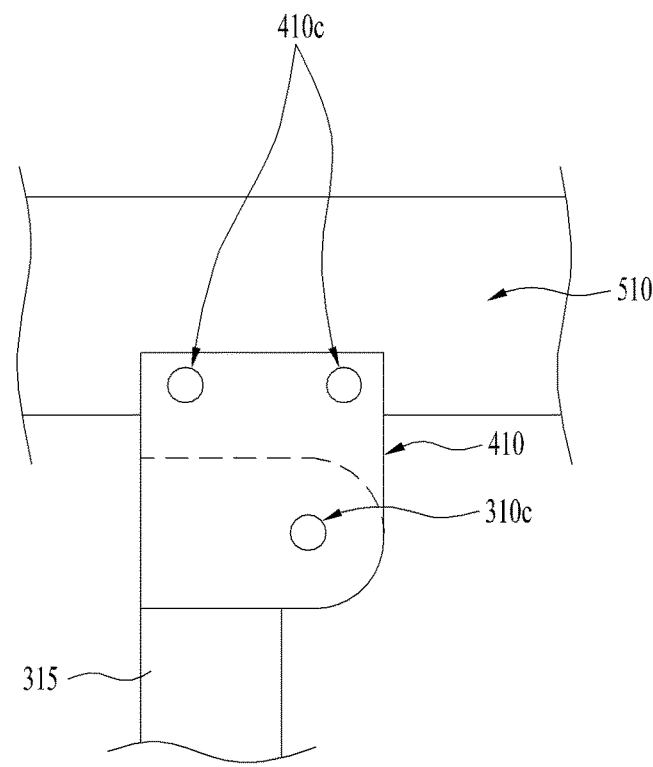

FIG. 3 is a view illustrating the connection relationship between the upper end portion of the flexible display panel 200 and the upper link frame 310 in the rollable display device.

FIG. 3(a) is a view illustrating the cross-section of the upper end portion of the flexible display panel. FIG. 3(b) is a view illustrating the rear surface of the upper end portion of the flexible display panel.

Referring to FIGS. 2(a), 2(b), 3(a), and 3(b), the rollable display device according to an embodiment of the present disclosure may further include an upper mount 510, located at the upper end portion of the rear surface of the flexible display panel 200, and a mounting bracket 410, positioned between the upper mount 510 and the upper link frame 310.

The mounting bracket 410 may be fixed to the upper mount 510 using a mount fixation pin 410c. The rear cover 600 may cover the mounting bracket 410. For example, the upper end portion of the rear cover 600 may be coupled to the upper mount 510 using a cover fixation pin 600c.

The rear cover 600 may be raised or lowered together with the flexible display panel 200. The rear cover 600 may be accommodated in the main body 100. For example, the main body 100 may further include a cover roller 170, around which the rear cover 600 is wound, and an elastic member configured to rotate the cover roller 170.

The upper end portion of the flexible display panel 200 may be raised or lowered together with the upper mount 510. For example, the flexible display panel 200 may be placed over the upper mount 510 using a connection member 220 such as a flexible printed circuit board (FPCE) or a tape carrier package (TCP) connected to a circuit board 210 configured to transmit a driving signal and a power signal to a display area. The rollable display device according to an embodiment of the present disclosure may further include an upper cap 520 configured to cover the connection member 220 and the upper mount 510.

In the rollable display device, it is described that the rear cover 600 is fixed to the mounting bracket 410. However, in the rollable display device according to another embodiment of the present disclosure, the rear cover 600 may be fixed to the upper mount 510 or to the upper cap 520.

The upper link bracket 315 of the upper link frame 310 may be coupled to the mounting bracket 410 using an upper fixation pin 310c. The lower end portion of the upper link frame 310 may rotate towards the center of the flexible display panel 200 with respect to the upper fixation pin 310c.

The connection relationship or coupling relationship between the upper end portion of the flexible display panel 200 and the upper link frame 310 in the rollable display device is not limited to the above embodiment. For example, the upper end portion of the flexible display panel may be coupled to an integrally formed cover member so as to be connected to a member configured to raise or lower the flexible display panel, such as the upper link frame.

Hereinafter, embodiments of the present disclosure will be described using the rollable display device illustrated in FIG. 4 as an example. However, it goes without saying that the rollable display device according to an embodiment of the present disclosure may be implemented as the rollable display device illustrated in FIGS. 1 to 3. Moreover, various embodiments of the present disclosure will be described later in detail with reference to FIGS. 4 to 6, and supplementary analysis is possible with reference to FIGS. 1 to 3.

Figure 4:
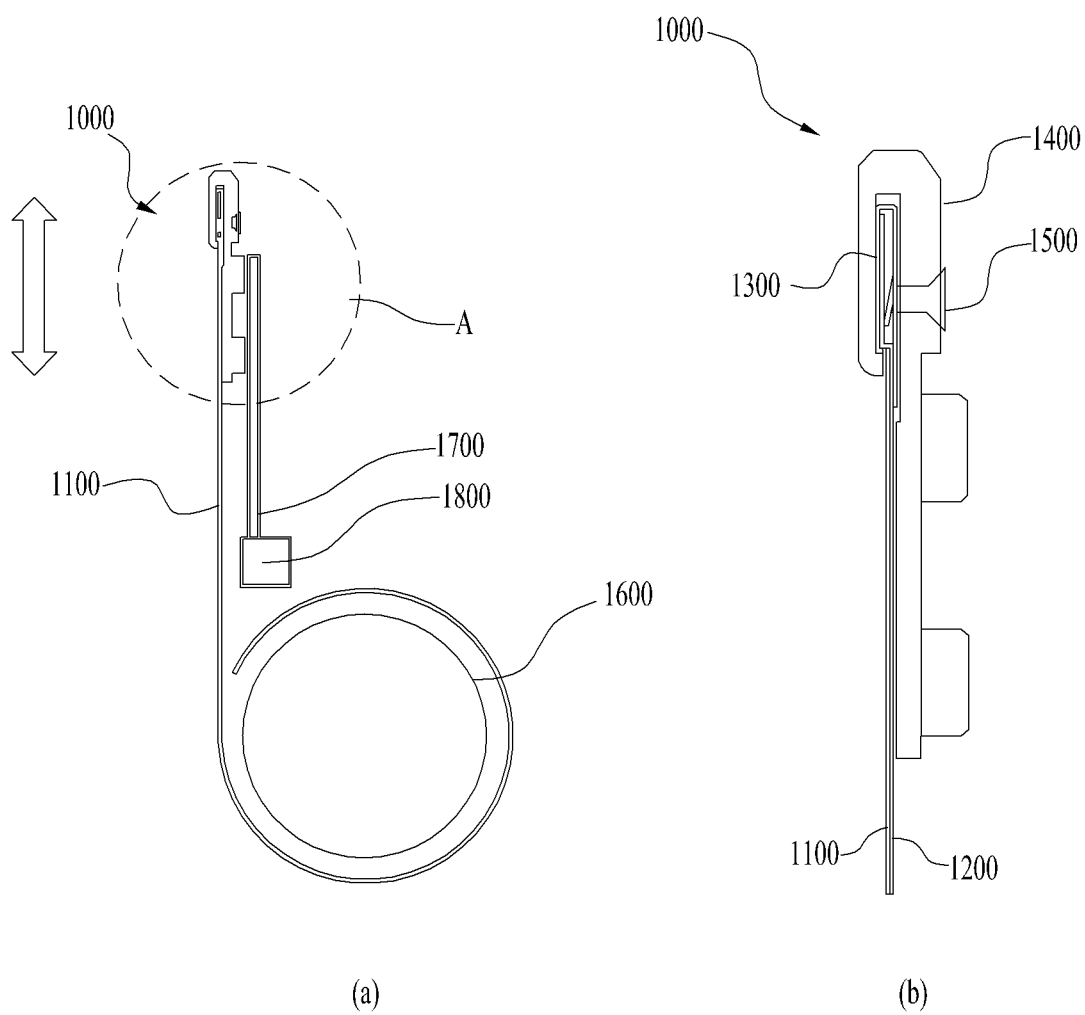
FIG. 4 is a view illustrating a rollable display device according to an embodiment of the present disclosure.

FIG. 4 is a view illustrating a rollable display device 1000 according to an embodiment of the present disclosure.

FIG. 4(a) is a side view of the rollable display device 1000 according to an embodiment of the present disclosure. FIG. 4(b) is an enlarged view of A in FIG. 4(a).

Referring to FIGS. 4(a) and 4(b), the rollable display device 1000 according to the present disclosure includes a flexible display panel 1100, a mesh sheet 1200, a guide plate 1300, a top cover 1400, and a pressing member 1500. The rollable display device 1000 may further include a main roller 1600, a link 1700, and a link-driving unit 1800. The guide plate 1300, the top cover 1400, and the pressing member 1500 may constitute a cover assembly.

The flexible display panel 1100 may be a display panel that realizes an image and is flexible. For example, the flexible display panel 1100 may be a flexible organic light-emitting display panel, a flexible light-emitting diode display panel, or a flexible electrophoretic display panel. The flexible display panel 1100 may be wound around the outer surface of the main roller 1600. The flexible display panel 1100 may be wound or unwound around the main roller 1600 in the raising or lowering direction (see the arrow in the drawing).

The mesh sheet 1200 may cover one surface of the flexible display panel 1100, and may have a mesh structure in which a plurality of holes is formed. For example, the flexible display panel 1100 may be attached to the front surface of the mesh sheet 1200. Here, the mesh sheet 1200 may be flexible so as to be capable of being wound or unwound together with the flexible display panel 1100. For example, the mesh sheet 1200 may be implemented as a metal sheet with a repeating pattern. As another example, the mesh sheet 1200 may be implemented as a plurality of supporting bars, each of which is rotatably connected to the others so as to bendably support the rear surface of the flexible display panel 1100. A portion of the mesh sheet 1200 may be bent to form a structure that prevents separation from the guide plate 1300. The mesh sheet 1200 may have mounted thereon components configured to drive the flexible display panel 1100. Hereinafter, the mesh sheet 1200 will be described in detail with reference to FIG. 5.

The guide plate 1300 accommodates one side of the mesh sheet 1200 so as to fix the mesh sheet 1200 inside the guide plate 1300. Here, the one side of the mesh sheet 1200 may be the upper portion of the mesh sheet 1200. The guide plate 1300 surrounds the one side of the mesh sheet 1200 to prevent the one end of the mesh sheet 1200 from being exposed to the outside. A portion of the guide plate 1300 may be made of a deformable material so as to fix the mesh sheet 1200. A portion of the guide plate 1300 may be bent to support a portion of the mesh sheet 1200. The guide plate 1300 may be implemented as a U-shaped frame with one side thereof open. Hereinafter, the guide plate 1300 will be described in detail with reference to FIGS. 5 to 7.

The top cover 1400 may cover a portion of the guide plate 1300, a portion of the mesh sheet 1200, or a portion of the flexible display panel 1100 so as to prevent an end of the mesh sheet 1200 or an end of the flexible display panel 1100 from being exposed to the outside. For example, the top cover 1400 may cover the outer surface of the guide plate 1300 that surrounds the end of the flexible display panel 1100 and the end of the mesh sheet 1200. The top cover 1400 may be raised or lowered together with the flexible display panel 1100. For example, the top cover 1400 may be fixed to the mesh sheet 1200, onto which the flexible display panel 1100 is attached, so as to be raised or lowered together with the mesh sheet 1200. Here, a structure configured to raise or lower the flexible display panel 1100 may be coupled to one side of the top cover 1400. Specifically, the structure configured to raise or lower the flexible display panel 1100 may be the link 1700 and the link-driving unit 1800. Here, the link 1700 and the link-driving unit 1800 may be implemented as the link assembly and the link-driving unit of FIGS. 1 to 3. The top cover 1400 may maintain the tension applied to the flexible display panel 1100. Here, the tension may be generated by the weight of the flexible display panel 1100 or the elastic structure of the main roller 1600 configured to wind the flexible display panel 1100. On one side of the top cover 1400, a hole through which the guide plate 1300 is pressed may be formed. Hereinafter, the configuration of the top cover 1400 will be described in detail with reference to FIG. 4.

The pressing member 1500 penetrates the top cover 1400 so as to fix the guide plate 1300 and the mesh sheet 1200. Specifically, the pressing member 1500 may deform a portion of the guide plate 1300 so as to bring the portion of the guide plate 1300 into contact with the mesh sheet 1200. Hereinafter, the pressing member 1500 will be described in detail with reference to FIGS. 6 and 7.

The main roller 1600 winds or unwinds the flexible display panel 1100 and the mesh sheet 1200.

The link 1700 may be connected to the top cover 1400 and to the link-driving unit 1800. The link 1700 may be rotated or moved by the link-driving unit 1800 so as to raise or lower the upper end portion of the flexible display panel 1100.

The link-driving unit 1800 may rotate or move the link 1700 so as to raise or lower the upper end portion of the flexible display panel 1100.

The main roller 1600, the link 1700, and the link-driving unit 1800 may be implemented as the main roller, the link assembly, and the link-driving unit of FIGS. 1 to 3. The structure configured to raise or lower the flexible display panel 1100 may be implemented in various ways, and is not limited to the main roller 1600, the link 1700, and the link-driving unit 1800.

Figure 5:
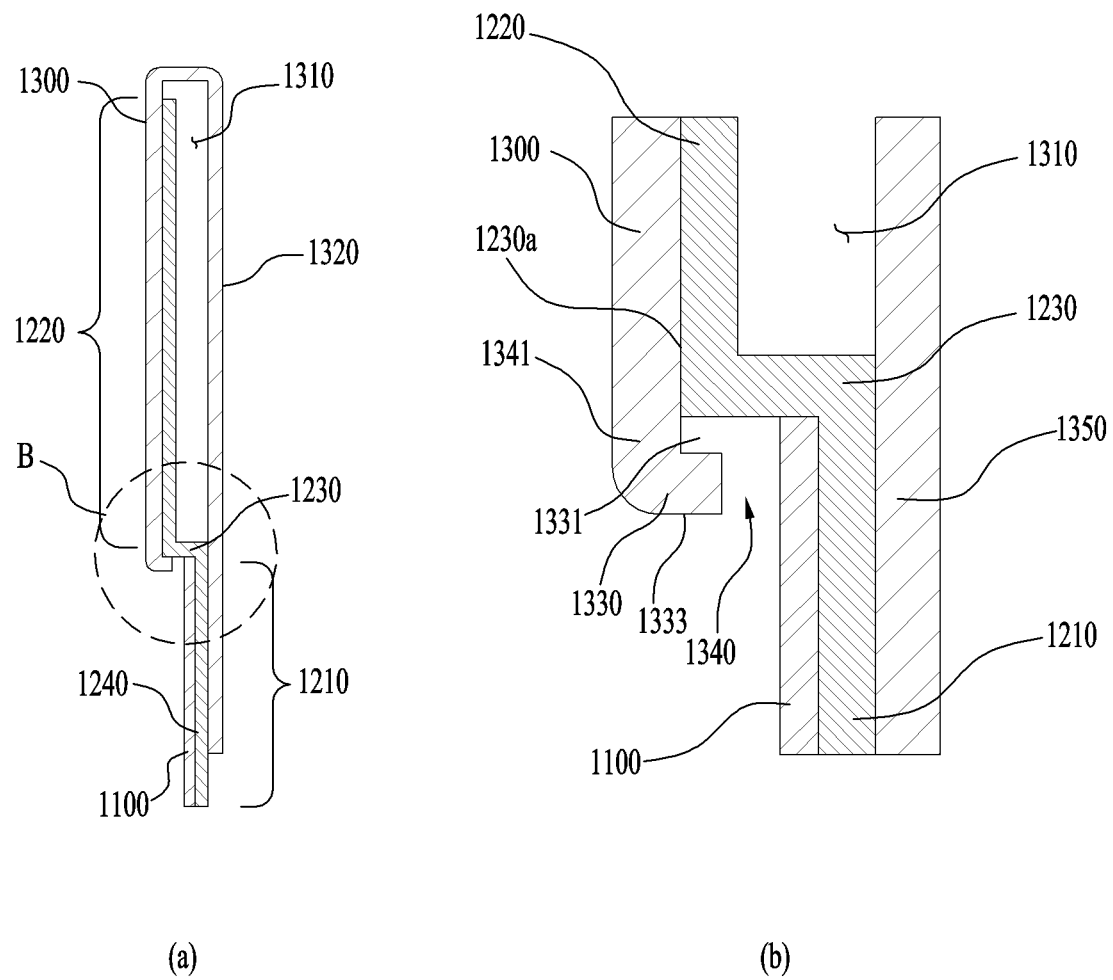
FIG. 5 is a view illustrating a coupling relationship between a mesh sheet and a guide plate according to an embodiment of the present disclosure.

FIG. 5 is a view illustrating the coupling relationship between the mesh sheet 1200 and the guide plate 1300 according to an embodiment of the present disclosure.

FIG. 5(a) is a view illustrating the cross-section of the mesh sheet 1200 and the guide plate 1300. FIG. 5(b) is an enlarged view of B in FIG. 5(a).

Referring to FIGS. 5(a) and 5(b), the mesh sheet 1200 includes a first region 1210, a second region 1220, and a stepped part 1230. The first region 1210, the second region 1220, and the stepped part 1230 may be provided on the front surface 1240 of the mesh sheet 1200.

The first region 1210 is a region onto which the flexible display panel 1100 is attached. For example, the first region 1210 may be a portion of the front surface 1240 of the mesh sheet 1200 onto which the flexible display panel 1100 is attached.

The second region 1220 is located above the first region 1210. For example, the second region 1220 may be an upper end portion of the mesh sheet 1200, which is the portion to which the flexible display panel 1100 is not attached. Here, the second region 1220 may be on the left side or the right side, depending on the direction in which the flexible display panel 1100 is wound or unwound.

The stepped part 1230 is formed between the first region 1210 and the second region 1220, and protrudes in a first direction. Here, the first direction may be a direction toward the position of the flexible display panel 1100 or a direction opposite thereto. The stepped part 1230 may be seated on a portion of the guide plate 1300 so as to limit movement of the mesh sheet 1200 in one direction. For example, a portion of the mesh sheet 1200 may be bent in a Z-shape so as to maintain the tension applied to the flexible display panel 1100 and to prevent separation of the mesh sheet 1200. The stepped part 1230 may include a stepped surface 1230*a* extending in the first direction. The stepped part 1230 may be formed at the point at which the flexible display panel 1100 ends so as to cover the end of the flexible display panel 1100.

Referring to FIGS. 5(*a*) and 5(*b*), the guide plate 1300 accommodates the upper portion of the mesh sheet 1200. Here, the upper portion of the mesh sheet 1200 may include the second region 1220 and the stepped part 1230. The guide plate 1300 may cover a portion of the first region 1210. In other words, the guide plate 1300 may accommodate a portion of the first region 1210, the second region 1220, and the stepped part 1230 so as to prevent an end portion of the flexible display panel 1100 from being exposed to the outside. The guide plate 1300 may be provided between the top cover 1400 and the mesh sheet 1200. The guide plate 1300 may include a first seating part 1330 and a fixing part 1320.

The first seating part 1330 is formed so as to protrude in a step shape in a second direction, which is opposite the first direction. For example, the guide plate 1300 may be provided as a U-shaped frame, one side 1340 of which is open, and the first seating part 1330 may be formed at an end portion 1341 of the one side 1340. Here, the one side 1340 of the guide plate 1300 may be the lower side of the guide plate 1300.

The stepped part 1230 is seated on one side 1331 of the first seating part 1330. The other side 1333 of the first seating part 1330 may be seated on the top cover 1400 so as to limit movement of the guide plate 1300 in one direction.

The first seating part 1330 may cover a portion of the stepped surface 1230*a* so as to accommodate the end portion of the flexible display panel 1100 inside the guide plate 1300.

The guide plate 1300 may cover the rear surface of the mesh sheet 1200 and extend downwardly of the stepped part 1230. Specifically, a portion of the guide plate 1300 that is in contact with the rear surface of the first region 1210 of the mesh sheet 1200 may cover the upper end of the first region 1210 on the rear surface of the mesh sheet 1200 in order to prevent deformation and separation of the stepped part 1230.

The fixing part 1320 is provided on the rear surface of the guide plate 1300 so as to fix the mesh sheet 1200 to the guide plate 1300. Hereinafter, the fixing part 1320 will be described in detail with reference to FIGS. 6 and 7.

Figure 6:
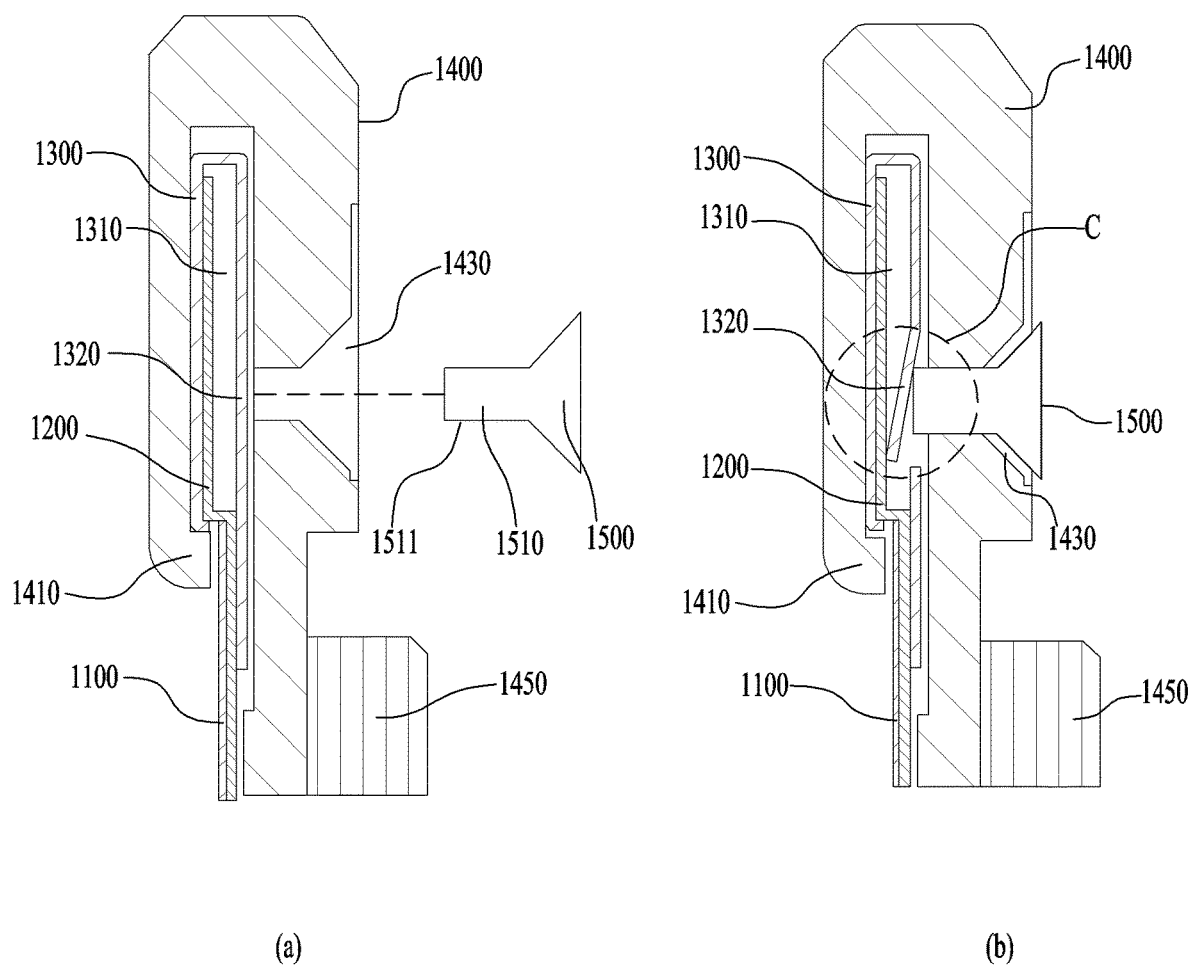
FIG. 6 is a view illustrating a coupling relationship between a mesh sheet, a guide plate, a cover, and a pressing member according to an embodiment of the present disclosure.

FIG. 6 is a view illustrating a coupling relationship between the mesh sheet 1200, the guide plate 1300, the top cover 1400, and the pressing member 1500 according to an embodiment of the present disclosure.

FIG. 6(*a*) is a view illustrating the state before the pressing member 1500 is coupled. FIG. 6(*b*) is a view illustrating the state after the pressing member 1500 is coupled.

Referring to FIGS. 6(*a*) and 6(*b*), the top cover 1400 covers the guide plate 1300. The top cover 1400 may include a second seating part 1410, a pressing hole 1430, and a fastening part 1450.

The second seating part 1410 is formed to protrude in the second direction, which is opposite the first direction, so as to seat thereon the other side 1333 of the first seating part 1330 of the guide plate 1300. In other words, the second seating part 1410 is formed to surround a portion or all of the other side 1333 of the first seating part 1330 so as to support the other side 1333 of the first seating part 1330. That is, the first seating part 1330 and the second seating part 1410 form a dual structure so as to maintain the tension of the flexible display panel 1100 and to prevent separation of the mesh sheet 1200. The first seating part 1330 and the second seating part 1410 may be formed in a direction toward the position of the front surface of the flexible display panel 1100.

The pressing hole 1430 is provided at one side of the top cover 1400 so as to receive the pressing member 1500 therein. Here, the one side may be the rear surface of the top cover 1400. The pressing hole 1430 may be formed at a position corresponding to the fixing part 1320 of the guide plate 1300. For example, the fixing part 1320 of the guide plate 1300 may be provided on the rear surface of the guide plate 1300, and the pressing hole 1430 may be formed in the rear surface of the top cover 1400. The pressing hole 1430 may be formed such that an opening in one side thereof is wider than an opening in another side thereof so as to facilitate assembly of the pressing member 1500. The pressing hole 1430 may further include a screw hole for screw fastening.

The fastening part 1450 is provided at a position corresponding to the rear surface of the flexible display panel 1100, and is connected to a device configured to raise or lower the flexible display panel 1100. For example, the fastening part 1450 may be connected to the link assembly of FIGS. 1 to 3.

Referring to FIGS. 6(*a*) and 6(*b*), the pressing member 1500 penetrates the top cover 1400 so as to closely adhere the mesh sheet 1200 and the guide plate 1300 to each other. Specifically, the pressing member 1500 is inserted into the pressing hole 1430 formed in one side of the top cover 1400 and presses the fixing part 1320 of the guide plate 1300 so as to closely adhere the guide plate 1300 and the mesh sheet 1200 to each other. Here, in order to reliably establish contact between the stepped part 1230 of the mesh sheet 1200 and the first seating part 1330 of the guide plate 1300, the pressing member 1500 may be inserted in the first direction, which is the same direction in which the stepped part 1230 protrudes. The pressing member 1500 includes a screw groove (not illustrated) and a pressing surface 1511.

The pressing surface 1511 may be formed at an end 1510 of the pressing member 1500 so as to maximize contact between the fixing part 1320 and the mesh sheet 1200.

The screw groove (not illustrated) is formed in the outer circumferential surface of the pressing member 1500 so as to enable the pressure of the pressing member 1500 to be easily adjusted.

Referring to FIG. 6(*b*), the fixing part 1320 is provided on the rear surface of the guide plate 1300 so as to closely adhere the guide plate 1300 and the mesh sheet 1200 to each other. Here, the rear surface may be a surface located in a direction opposite the direction in which the flexible display panel 1100 is located. Specifically, the fixing part 1320 presses the mesh sheet 1200 located in an inner space 1310 of the guide plate 1300 so as to fix the mesh sheet 1200 between the surface forming the inner space 1310 of the guide plate 1300 and the fixing part 1320. The fixing part 1320 may be deformed in shape due to being pressed by the pressing member 1500 in order to minimize deviation during assembly. Hereinafter, the fixing part 1320 will be described in detail with reference to FIG. 7.

Figure 7:
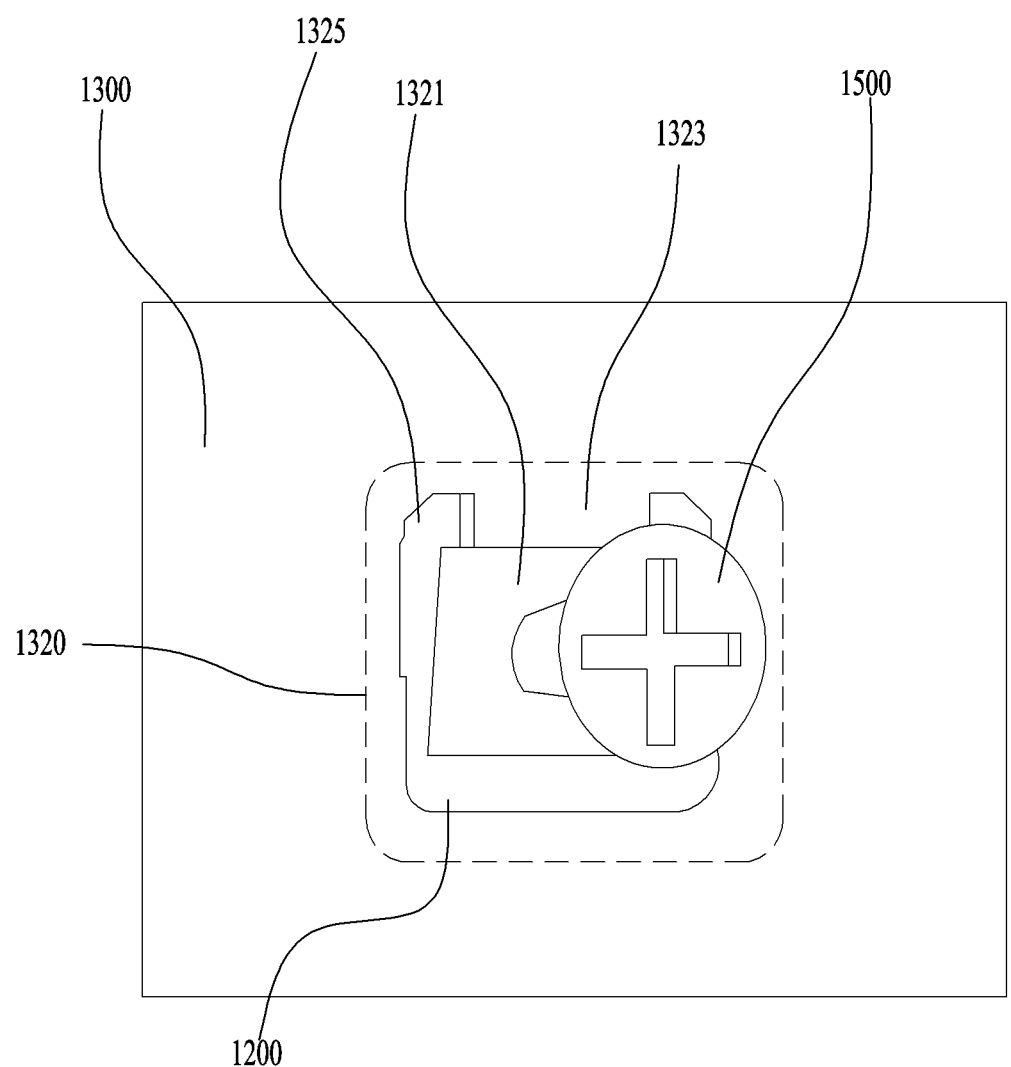
FIG. 7 is a view illustrating C in FIG. 6.

FIG. 7 is a view illustrating C in FIG. 6.

Referring to FIG. 7, the fixing part 1320 may be formed by cutting out a portion of the guide plate 1300. For example, the fixing part 1320 may be formed by cutting out a portion of the rear surface of the guide plate 1300 to form a U shape. The fixing part 1320 is closely adhered to the mesh sheet 1200 by the pressure of the pressing member 1500. That is, as the pressing member 1500 is inserted, the fixing part 1320 may be bent inwards so as to be brought into contact with the mesh sheet 1200. Here, the fixing part 1320 may be deformed into a shape corresponding to that of the rear surface of the mesh sheet 1200 or the pressing surface 1511 so as to maximize contact with the mesh sheet 1200. Here, the contact may be surface contact. The fixing part 1320 includes a connection part 1323 and a cutout 1325 on the periphery thereof.

The connection part 1323 is formed on one side of the periphery of the fixing part 1320 so as to connect the fixing part 1320 and the guide plate 1300. The connection part 1323 may be bent inwards by the pressure of the pressing member 1500.

The cutout 1325 is formed around the periphery of the fixing part 1320. The cutout 1325 may form a predetermined gap between the fixing part 1320 and the guide plate 1300 so as to facilitate deformation of the fixing part 1320.

According to one embodiment of the present disclosure, the present disclosure may be capable of reliably withstanding the tension of the mesh sheet.

According to another embodiment of the present disclosure, the present disclosure may realize a slim appearance.

According to still another embodiment of the present disclosure, the present disclosure has an improved assembling performance.

It will be apparent to those skilled in the art that the present disclosure may be embodied in other specific forms, without departing from the spirit or essential characteristics thereof.

Accordingly, the above detailed description should not be interpreted as limiting in all aspects, but should be considered as illustrative. The scope of the disclosure should be determined by reasonable interpretation of the appended claims, and all changes within the equivalent scope of the disclosure are included in the scope of the disclosure.

What is claimed is:

1. A rollable display device comprising:
   a flexible display panel;
   a mesh sheet comprising, a first region where the flexible display panel is attached on a front surface thereof, a second region located above the first region, and a stepped part between the first region and the second region and protruding from the first region in a first direction;
   a guide plate, configured to receive an upper portion of the mesh sheet comprising the second region and the stepped part, and comprising a fixing part positioned on a back surface of the guide plate;
   a top cover configured to cover the guide plate and having therein a pressing hole formed at a location corresponding to the fixing part; and
   a pressing member inserted into the pressing hole so as to adhere the fixing part to the mesh sheet,
   wherein the guide plate comprises a first seating part formed to protrude in a second direction, which is opposite the first direction, so as to support a lower part of the stepped part.

2. The rollable display device of claim 1, wherein the guide plate is provided as a U-shaped frame with open bottom, and the first seating part is formed at an end portion of the one side of the U-shaped frame.

3. The rollable display device of claim 1, wherein the top cover comprises a second seating part formed to protrude in the second direction, which is opposite the first direction, so as to support a lower part of the first seating part.

4. The rollable display device of claim 1, wherein the fixing part is deformed in shape due to being pressed by the pressing member.

5. The rollable display device of claim 4, wherein the fixing part is formed by cutting out a portion of the guide plate.

6. The rollable display device of claim 5, wherein a periphery of the fixing part comprises:
   a connection part connected to a rear surface of the guide plate; and
   a cutout formed by cutting out a portion of the rear surface of the guide plate, and
   wherein the connection part is bent due to being pressed by the pressing member.

7. The rollable display device of claim 1, wherein the pressing member comprises, at an end portion thereof in the first direction, a pressing surface configured to press the fixing part.

8. The rollable display device of claim 7, wherein the pressing member is inserted in the first direction.

9. The rollable display device of claim 1, wherein the first direction is a direction toward a position of the flexible display panel in the first region.

10. The rollable display device of claim 1, further comprising:
    a main roller configured to wind or unwind the flexible display panel;
    a link coupled to one side of the top cover; and
    a link-driving unit configured to drive the link so as to raise or lower the top cover.

11. The rollable display device of claim 10, wherein the top cover is provided with, on one side thereof, a fastening part to which the link is coupled.

12. The rollable display device of claim 1, wherein the guide plate is a U-shaped frame with open having one side in contact with a front surface of the second region and the other side contacting with a rear surface of the first region.

13. The rollable display device of claim 1, wherein the stepped part covers an upper end of the flexible display panel.

14. A rollable display device comprising:
    a flexible display panel;
    a mesh sheet comprising, a first region where the flexible display panel is attached on a front surface thereof, a second region located above the first region, and a stepped part between the first region and the second region and protruding from the first region in a first direction;
    a guide plate, configured to receive an upper portion of the mesh sheet comprising the second region and the stepped part, and comprising a fixing part positioned on a back surface of the guide plate;
    a top cover configured to cover the guide plate and having therein a pressing hole formed at a location corresponding to the fixing part; and
    a pressing member inserted into the pressing hole so as to adhere the fixing part to the mesh sheet,
    a main roller configured to wind or unwind the flexible display panel;
    a link coupled to one side of the top cover; and
    a link-driving unit configured to drive the link so as to raise or lower the top cover.

15. The rollable display device of claim 14, wherein the top cover is provided with, on one side thereof, a fastening part to which the link is coupled.

16. A rollable display device comprising:
    a flexible display panel;

a mesh sheet comprising, a first region where the flexible display panel is attached on a front surface thereof, a second region located above the first region, and a stepped part between the first region and the second region and protruding from the first region in a first direction;

a guide plate, configured to receive an upper portion of the mesh sheet comprising the second region and the stepped part, and comprising a fixing part positioned on a back surface of the guide plate;

a top cover configured to cover the guide plate and having therein a pressing hole formed at a location corresponding to the fixing part; and a pressing member inserted into the pressing hole so as to adhere the fixing part to the mesh sheet, wherein a periphery of the fixing part comprises:

a connection part connected to a rear surface of the guide plate; and a cutout formed by cutting out a portion of the rear surface of the guide plate, and wherein the connection part is bent due to being pressed by the pressing member.

\* \* \* \* \*